United States Patent [19]

Maier

[11] Patent Number: 4,968,946

[45] Date of Patent: Nov. 6, 1990

[54] APPARATUS AND METHOD FOR DETERMINING RESISTANCE AND CAPACITANCE VALUES

[75] Inventor: Lawrence C. Maier, New Haven, Vt.

[73] Assignee: Simmonds Precision Products, Inc., Wilmington, Del.

[21] Appl. No.: 338,065

[22] Filed: Apr. 14, 1989

Related U.S. Application Data

[63] Continuation-in-part of Ser. No. 42,229, Apr. 24, 1987, abandoned.

[30] Foreign Application Priority Data

| Apr. 14, 1988 | [EP] | European Pat. Off. | 88303383.9 |
| Apr. 19, 1988 | [IL] | Israel | 86117 |
| Apr. 22, 1988 | [CA] | Canada | 564913 |
| Apr. 25, 1988 | [JP] | Japan | 63-100412 |

[51] Int. Cl.⁵ ........................................... G01R 27/26
[52] U.S. Cl. ..................................... 324/671; 324/649; 324/672; 324/679
[58] Field of Search ............... 324/60 R, 60 C, 61 R, 324/57 R, 658, 649, 676, 678, 679, 607, 663, 671, 672; 73/304 C; 340/618, 620, 612

[56] References Cited

U.S. PATENT DOCUMENTS

| 3,530,379 | 9/1970 | Demerliac | 324/60 R |
| 4,080,562 | 3/1978 | Rubel et al. | 324/60 CX |
| 4,426,616 | 1/1984 | Maier | 324/60 CX |
| 4,820,973 | 4/1989 | Alvarez | 324/60 C |

Primary Examiner—Reinhard J. Eisenzopf
Assistant Examiner—Robert W. Mueller
Attorney, Agent, or Firm—Dale R. Lovercheck

[57] ABSTRACT

Apparatus and method for determining capacitive and resistive values of an electrical component, such as a fuel level determining probe, includes a waveform generator for subjecting the probe to a time-varying waveform that includes a linearly varying ramp portion and a fixed, constant portion. A selectively controlled sample and hold circuit senses the voltage potential of the probe in response to a zero-crossing detector during the linearly varying ramp portion of the waveform to provide information indicative of the capacitive value and again senses the voltage potential at selected time thereafter during the fixed portion of the waveform to provide resistive value information. The output of the sample and hold is provided to an analog-to-digital converter which provided digital information to a stored-program controlled processor which provides the desired output information. In one form of the invention, a calibration standard is periodically switched into the circuit to provide reference values for comparison against the measured values.

18 Claims, 4 Drawing Sheets

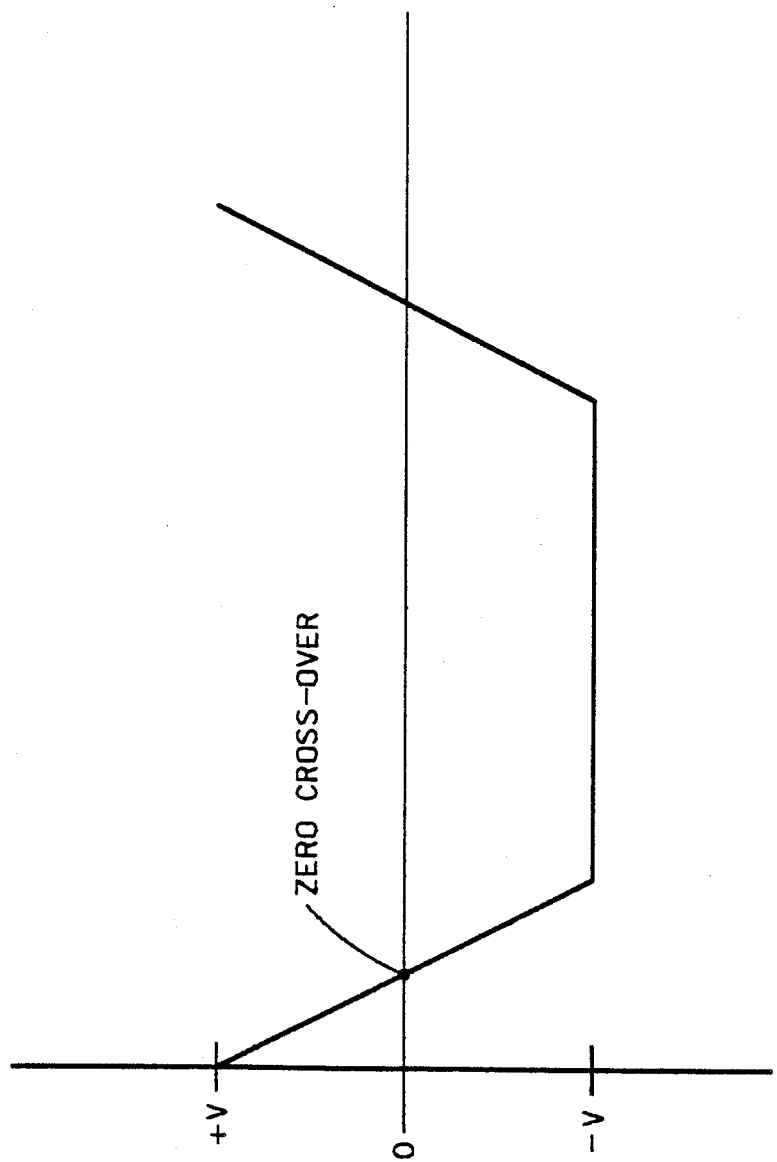

APPARATUS AND METHOD FOR DETERMINING RESISTANCE AND CAPACITANCE VALUES

This is a continuation-in-part of U.S. patent application Ser. No. 07/042,229, filed Apr. 24, 1987 now abandoned.

BACKGROUND OF THE INVENTION

The present invention relates to apparatus and method for determining capacitance and resistance values in an electrical component and, more particularly, to an apparatus and method for determining capacitance and resistance values of an electrical sensor, such as a fuel level sensor, having both capacitive and resistive characteristics.

Various sensor applications use the change in capacitance of a sensor as an indication of a to-be-measured physical parameter. For example, in measuring the level of fuel in a fuel tank in an aircraft, a capacitive probe is positioned within the tank. The probe typically includes structure which defines capacitor plates or the functional equivalent with the dielectric constant between the plates determined by the level of the fuel in the tank as well as the air in the airspace above the fuel. The sensed capacitance is a function, in part, of the fuel level in the tank. In an optimal capacitive-type sensing system, the electrical resistance between the plates is very high, on the order of hundreds of megaohms, and normally does not influence the capacitive sensing function. However, under certain circumstances, abnormal conditions within the fuel tank can contribute to an unusually low resistance path between the capacitive plates. A low resistance condition can adversely affect the validity of the capacitance measurement. Such abnormal conditions include, for example, the presence of water in the fuel tank, contaminants that possess electrolytic properties, and microorganisms in the fuel. Thus, in sensing fuel levels using capacitive probes, it is also important to sense the resistance between the plates of the probe to determine the general conditions within the tank and provide an indication of those conditions which may adversely affect capacitance measurements.

The present invention provides improved timing at which the measurements are taken over Rubel et al. In Rubel et al., the sampling measurement occurs at the point in time in which the waveform is at a zero voltage value. In the apparatus of Rubel et al., failure to sample at exactly the zero voltage point results in a direct error in the measured value of the capacitance in the presence of any resistance. Such timing errors result from circuit path delay variations caused by component tolerances, time variations, and temperature variations of amplifiers and components. In Rubel et al., these timing errors remain uncorrected.

The present invention avoids the timing problems of Rubel et al. by employing a linearly varying ramp voltage which goes from one voltage potential through zero to the opposite polarity potential. The capacitance measurement is taken at approximately the zero-crossing of the excitation waveform to maximize the available dynamic range, but it is not a requirement of the invention that the measurement be taken exactly at zero as in Rubel et al. A correction factor provided in the self-calibration feature of the present invention corrects for any circuit errors. The present invention is stable under variations of components with respect to type, temperature, tolerances and time. This stability makes the present invention particularly flexible in the component requirements for its manufacture since any variation of the zero-crossing sample point is corrected for and has no affect on the final measured capacitance value.

Rubel et al. disclose a measurement technique which employs an open loop scheme, in which any variation in any of the circuit switching blocks results in a direct error in the measurement, and there is no system feedback loop. The apparatus of the present invention provides an accuracy of 0.25% without using precision components.

The present invention uses a closed loop technique which continuously self-calibrates the measurement circuitry as the measurements are made. Any offset to the measured values of capacitance annd resistance is monitored immediately before and after each measurement cycle. Standard components may be used to build the invention with no effect on long term accuracy or temperature stability.

Maier in U.S. Pat. No. 4,426,616 discloses a capacitance measurement system employing a capacitance reference. The present invention includes a resistance reference in a capacitance measuring circuit. A capacitor is sensitive to frequency which affects its signal amplitude and phase, while a resistor is not frequency sensitive. The phase of a resistor and capacitor are 90° apart. The problems caused by the amplitude and phase differences resulting from using a resistor to calibrate a capacitance measuring circuit usually result in poor operating accuracy. The present invention solves the problem of amplitude and phase differences so that a readily available resistor of high stability and known value may be used as a reference for capacitance measuring circuit rather than a precision capacitor.

The present invention uses the same circuitry to measure both capacitance and resistance. The circuitry used is thus compact and combines one calibration reference for both resistance and capacitance measurements.

The present invention accomplishes resistance and capacitance measurements without any switches in the signal path.

The present invention uses no switches and accomplishes scaling by changing the rate of time-varying of the excitation interrogation waveform. The present invention is able to accurately operate and measure a wide range of electrical components simply by varying the interrogation waveform excitation ram rate. These changes are readily accomplished and allow the design flexibility to fuction correctly over a wide range of sensor conditions with no circuitry changes required.

SUMMARY OF THE INVENTION

In view of the above, it is an object of the present invention, among others, to provide an apparatus for independently determining capacitance and resistance values of an electrical component in a rapid and efficient manner.

It is an another object of the present invention to provide an apparatus for independently determining capacitance and resistance values of an electrical component in which the capacitance value is a measure of a physical parameter and the resistance value, in part, is related to the validity of the measured capacitance value.

It is an another object of the present invention to provide an apparatus for independently determining capacitance and resistance values of an electrical sensor useful for measuring liquid levels and which can self-calibrate before or after the capacitance and resistance determination.

It is another object of the present invention to provide a method for quickly and accurately determining the capacitance and resistance values of an electrical component, without the use of precision components or precision timing relationships.

In view of therse objects, and others, the present invention provides an apparatus and method for determining capacitive and resistive values of an electrical component, such as a capacitive sensor, in an efficient and accurate manner. In one form of the invention, a stored-program processor-controlled bounded integrator and multiplexer provide a time-varying interrogation voltage output to selected ones of a sensor reference and a plurality of sensors that provide a capacitance value representative of a measured parameter and a resistance value which may affect the capacitance value. The time-varying voltage includes symmetrical limits of opposite polarity and is controlled to vary at a constant rate between the opposite limits. The current through the selected sensor reference or sensor is converted through a transconductance amplifier to a corresponding voltage value which is converted, at appropriate times, into a binary value for evaluation by the processor.

In another form of the present invention, a waveform generator subjects an electrical sensor to a time-varying interrogation waveform that includes a linearly varying ramp portion and a fixed portion. The linearly varying ramp portion has an initial voltage of a value V of a first polarity and changes in a linear manner to a voltage V of a second polarity and remains at the second polarity for a selected time period. A selectively controlled sample and hold circuit senses the voltage potential of the sensor at a selected time during the linearly varying ramp portion of the waveform to provide information indicative of the capacitive value and at a selected time on the fixed portion of the waveform to provide information indicative of the resistive value. The output of the sample and hold circuit is provided to an analog-to-digital converter which provides digital information to a stored-program controlled processor for determination of the desired information. The sample and hold circuit is controlled, in part, either by a zero-crossing detector or by timing from the start of the waveform which determines when the linearly varying ramp portion of the interrogation waveform is about zero to trigger the sample and hold circuit into operation. A calibration standard is periodically switched into the circuit to provide reference values for comparison against measured values.

In its best mode, the invention is utilized to measure the capacitance of a liquid-level probe in a fuel tank with the capacitance measurement indicative of the fuel level and the resistance measurement indicative of conditions that can adversely affect the validity of the capacitance measurement, these adverse conditions including the presence of water, electrolytic contaminants, microorganisms, and the like.

The present invention advantageously provides apparatus and method for determining capacitance and resistance values of an electrical component, such as a capacitive fuel level sensing probe, in an accurate and efficient manner.

The invention provides an apparatus and method for determining capacitive and resistive values of an electrical component, such as a capacitive sensor. A linear time-varying interrogation voltage is applied to an electrical component, and, during the application of the interrogation voltage, a current dependent value of the electrical component is measured. This measurement is used to determine the capacitance of the electrical component. A constant voltage is applied across the electrical component before and after application of the time-varying voltage. The resistance of the electrical component is determined from the current dependent values sensed across the electrical component under the constant voltage potential.

A time-varying voltage having a linear ramp voltage passes from one voltage level through zero to a second voltage level of the opposite polarity. A current sensor measures a constant voltage current flow through an electrical component and a time-varying voltage current flow. The capacitance is determined from the time-varying voltage since capacitance is related to voltage rate of change, while the resistance is determined from the constant voltage current flow, since resistance is related directly to voltage.

Other objects and further scope of applicability of the present invention will become apparent from the detailed description to follow, taken in conjunction with the accompanying drawings, in which like parts are designated by like reference characters.

BRIEF DESCRIPTION OF THE DRAWING

FIG. 3 is an idealized graphical illustration of an interrogation waveform used with the circuit of FIG. 2.

DESCRIPTION OF THE PREFERRED EMBODIMENT

Figure 1:
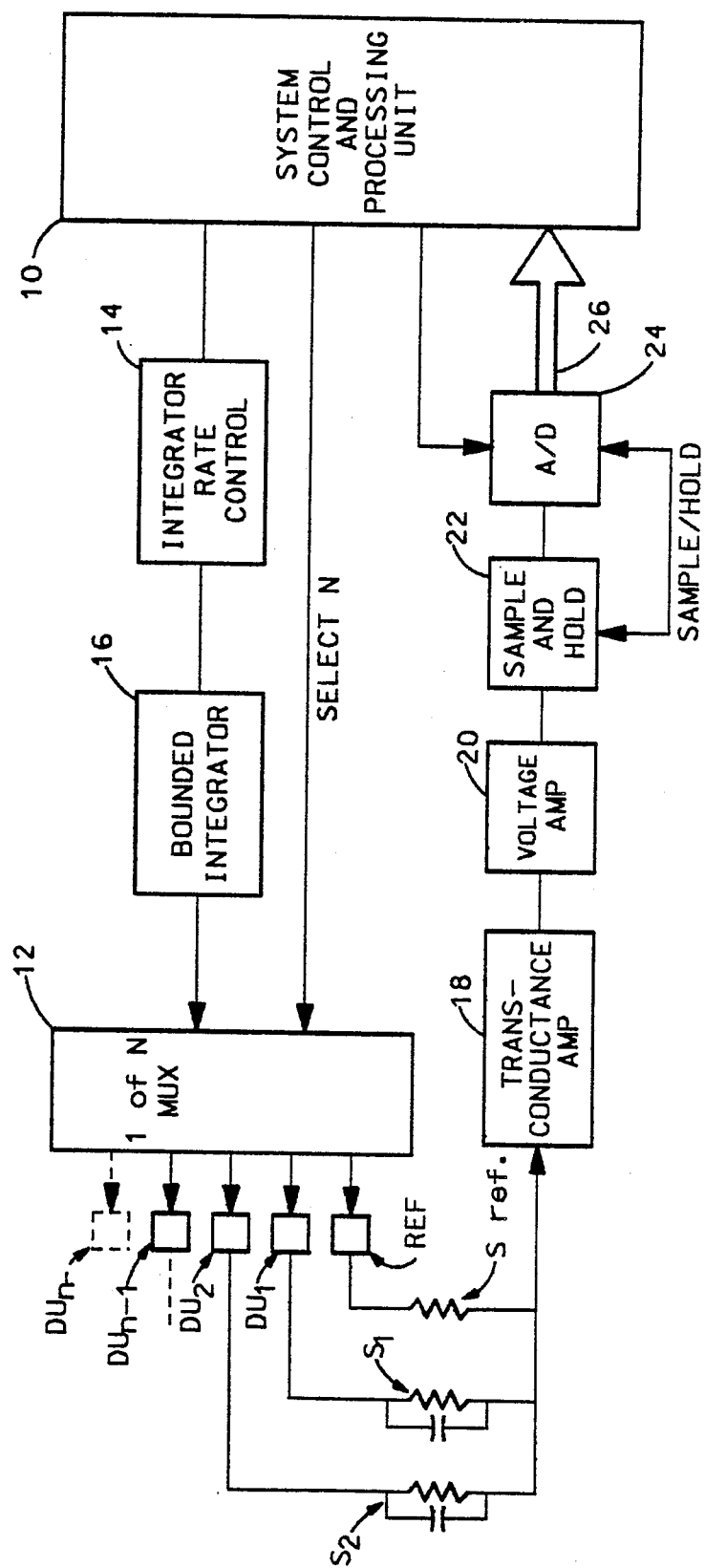
FIG. 1 is a schematic block diagram of a first circuit embodiment of the present invention.
Figure 1A:
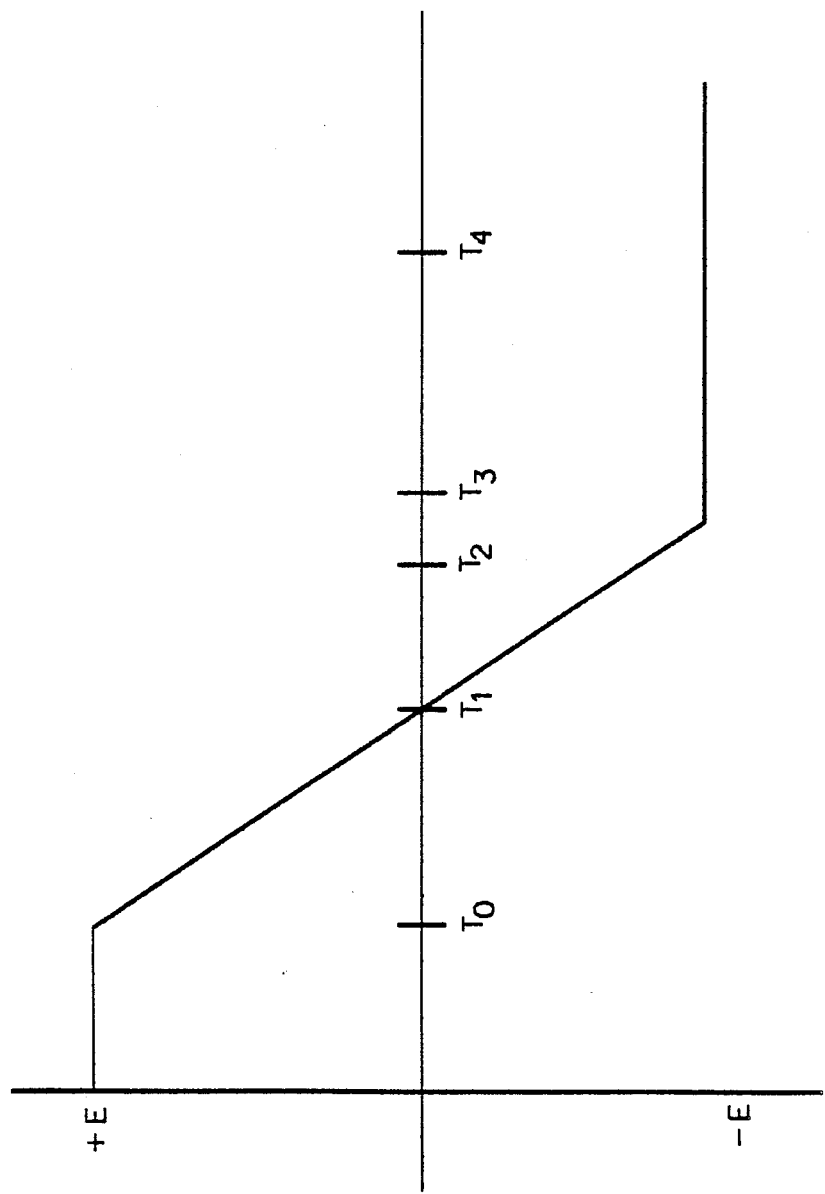
FIG. 1A is an idealized graphical illustration of an interrogation waveform used with the circuit of FIG. 1.

A preferred embodiment of the present invention is shown in FIGS. 1 and 1A and includes, as shown, a system control and processing unit 10 which provides output control signals to a one-of-N multiplexer 12 and a integrator rate controller 14, which, in turn, provides rate control signals to a bounded integrator 16. The bounded integrator 16 provides symmetrical voltage limits of opposite polarity, for example, of $+10$ and $-10$ VDC, with the rate of change of the output between these two limits controlled by the integrator rate controller 14 under instruction from the system control and processing unit 10. As shown in FIG. 1A, the bounded integrator 16 is initialized to provide a $+E$ output which declines at time $T_0$ from the initial $+E$ value through zero at time $T_1$ to the opposite $-E$ output at time $T_3$. The system control and processing unit 10 includes either an internal or external clock and appropriate counters that accumulate clock pulses to accurately determine selected times $T_n$ in the timing cycle of FIG. 1A. The rate of change of the voltage potential with time is controlled by the integrator rate controller 14. The negative limit $-E$ is maintained for a selected period of time and then the maximum positive rate is requested by the system control and processing unit 10 to return to the positive limit $+E$ and begin a new measurement cycle. The multiplexer 12 is of a 1-of-N type under the control of the system control and processing unit 10 and provides the voltage output of the bounded integrator 16 to a selected one of N output lines. A reference driver unit REF and a plurality of driver units $DU_1 \ldots DU_n$ are connected to the various output lines of the multiplexer 12. The reference driver unit REF is connected to a sensor reference $S_{ref}$ having predetermined or otherwise known resistance characteristic $R_{ref}$, and the various driver units $DU_1 \ldots DU_n$ are connected to respective sensors $S_1 \ldots S_n$. Each of the sensors $S_n$ has capacitive and resistive characteristics that vary as a function of a to-be-measured environmental characteristics. For example, the sensors $S_n$ can be formed as capacitive elements in which the capacitance varies as a function of a liquid level between the elements. The various sensors $S_n$ are connected in common circuit with one another and the input of a transconductance amplifier 18 which converts the current flow of a selected sensor $S_n$ or the sensor reference $S_{ref}$ to a voltage for amplification by a voltage amplifier 20. A sample and hold circuit 22 accepts the output of the voltage amplifier 20 at selected times during the application of the waveform of FIG. 1A to a selected sensor $S_n$. An analog-to-digital converter 24 accepts, under the control of the system control and processing unit 10, the output of the sample and hold circuit 22 and provides a corresponding binary value along a data bus 26 to an input of the system control and processing unit 10.

The embodiment of FIGS. 1 and 1A operates to selectively poll the sensor reference $S_{ref}$ and the various sensors $S_n$. For example, the system control and processing unit 10 controls the multiplexer 12 to select the sensor reference $S_{ref}$ and controls the bounded integrator 16 to provide an interrogation voltage waveform of the type shown in FIG. 1A through the reference driver unit REF to the sensor reference $S_{ref}$. The current drawn through the sensor reference $S_{ref}$ is converted by the transconductance amplifier 18 to a voltage which, in amplified form through the voltage amplifier 20, is provided to the sample and hold circuit 22. The analog-to-digital converter 24 operates to sample the output of the voltage amplifier 20 at selected times $T_0, T_1, T_2, T_3,$ and $T_4$ while the interrogation voltage is concurrently controlled by the system control and processing unit 10. The sample and hold circuit 22 is maintained in its hold mode while the analog-to-digital converter 24 converts the held voltage value into a binary word for the system control and processing unit 10. Once the analog-to-digital conversion is accomplished, the sample and hold circuit 22 is returned to its sample mode When the reference driver unit REF and its connected sensor reference $S_{ref}$ are subjected to the interrogation voltage, the sample and hold circuit 22 is controlled to hold a voltage value at time $T_1$, when the interrogation voltage passes through zero, to provide an output value $F_{ref}(T_1)$, at time $T_2$ to provide an output value $F_{ref}(T_2)$, and at time $T_4$, when the interrogation voltage is at its negative limit $-E$, to provide an output value $F_{ref}(T_4)$.

In the preferred form, the multiplexer 12 is driven through an operating cycle in which the reference driver unit REF and each of the sensors $S_n$ is interrogated in a sequential manner with the output values provided to the analog-to-digital converter 24 and to the system control and processing unit 10. After the reference driver unit REF is interrogated, the first sensor $S_1$ is interrogated and the sample and hold circuit 22 controlled to provide held voltage values at times $T_1$ and $T_4$ to provide corresponding outputs $F_{rc}(T_1)$ and $F_{rc}(T_4)$. Once the output values are determined for the reference driver unit REF and the selected sensor $S_1$, the capacitance and resistive values of the interrogated sensor can be determined from equations EQ. 1 and EQ. 2 using both the information obtained from the sensor reference $S_{ref}$ and the selected sensor $S_1$.

$$C = A * B \qquad \text{EQ. 1}$$
where
$$A = [F_{rc}(T_1) - (F_{ref}(T_1) * F_{rc}(T_4)/F_{ref}(T_4)]$$
$$B = (T_2 - T_1)/[(F_{ref}(T_2) - F_{ref}(T_1)) * R_{ref}]$$

$$R = F_{ref}(T_4) * R_{ref}/F_{rc}(T_4) \qquad \text{EQ. 2}$$

where $R_{ref}$ is the value of the resistance in the sensor reference $S_{ref}$.

Since the current through a capacitor is only proportional to the rate of voltage change across the capacitor, and since the current through a resistor is proportional only to the voltage across the resistor at any instant in time and not to the rate of the voltage change, the current in the transconductance amplifier 18 at the time $T_1$ is proportional only to the capacitance value and not the resistance value. The current is only proportional to capacitance at time $T_1$ since the voltage is zero at time $T_1$ and there is no resistive current flow. Conversely, at time $T_4$ the current is only proportional to the resistance and without any contribution from the capacitance since, at time $T_4$, the voltage is held constant at the negative limit $-E$. Since current through a capacitor is proportional only to the capacitance and the rate of voltage change, it is possible to scale the system for different capacitance ranges by changing the rate of voltage change from times $T_0$ to $T_3$ under the control of the system control and processing unit 10 and the integrator rate controller 14.

The equations for R and C use a resistor $R_{ref}$ of the sensor reference $S_{ref}$ and having a predetermined value to measure the exact rate of voltage change and also compensate for any capacitance reading errors that may result from not making the $T_1$ measurement at the exact waveform zero voltage crossing due to timing errors in the system. By using the reference resistance $R_{ref}$ to calibrate the system of FIG. 1, the sensor resistance and capacitance values are accurately determined independently of any drift or errors in the circuitry. Thus, the measurement accuracy is dependent only upon the accuracy of the reference resistance $R_{ref}$ and the accuracy of the analog-to-digital converter 24 and the sample and hold circuit 22. Accordingly, the embodiment of FIGS. 1 and 1A is self-calibrating and stable with both time and temperature. Prior to measuring the $T_0, T_1, T_2$ and $T_4$ values, a measurement is made at $T_0, T_1, T_2$ and $T_4$ with no sensor or reference connected. These measured values represent system offsets, and are subtracted from the $T_0, T_1, T_2$ and $T_4$ measurements prior to using EQ.1-E-Q.2. This ensures that the R and C measured values are not dependent on offsets within the system. As these offsets change, the R and C calculation values are automatically corrected.

Figure 2:
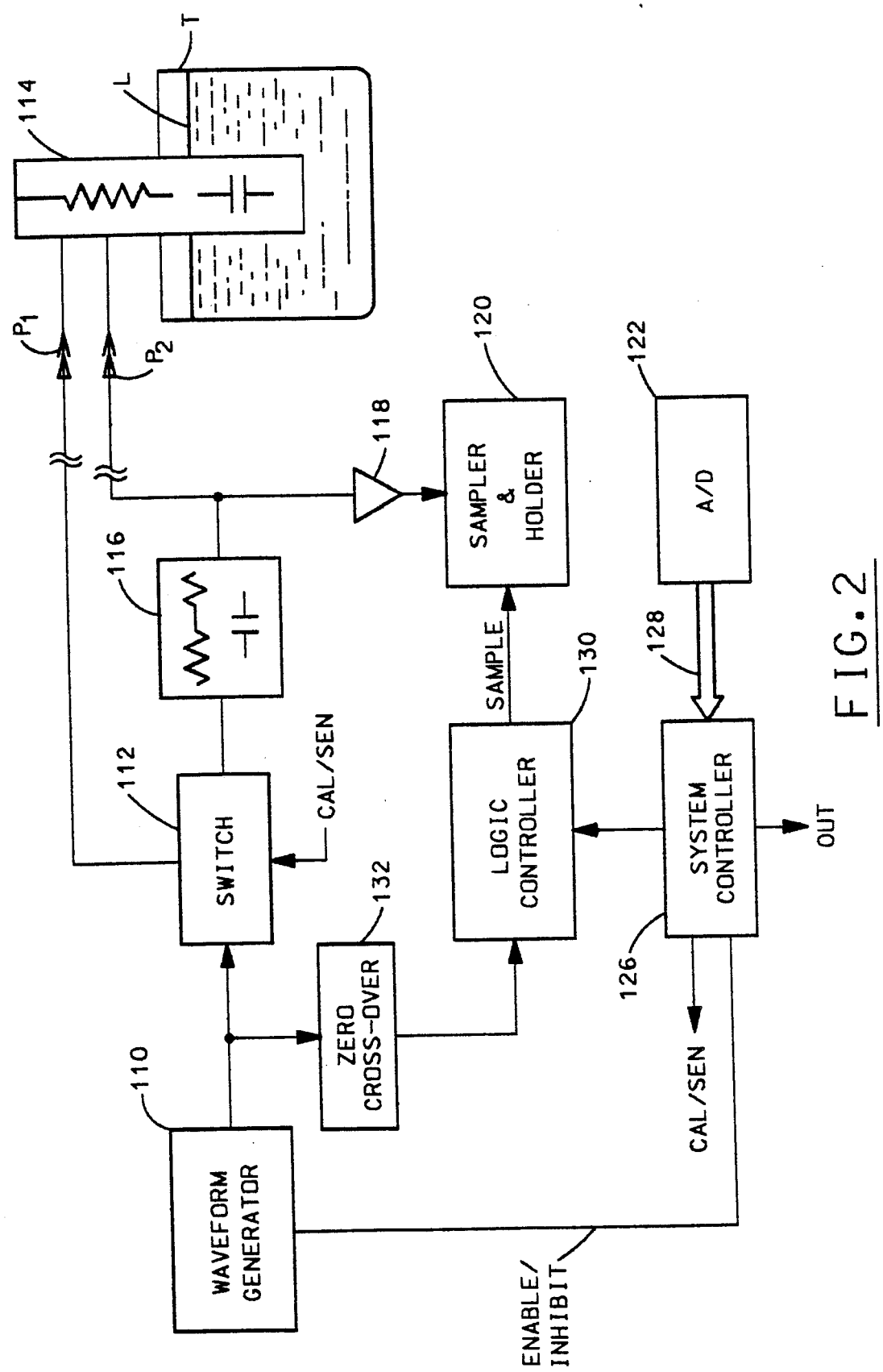
FIG. 2 is a schematic block diagram of a circuit for determining capacitance and resistance values of an electrical component, such as a liquid level sensor.

Another embodiment of the present invention is shown in schematic form in FIG. 2 and, as shown, a wave form generator 110 is connected to a switch 112 which, in turn, provides a switched output to either a sensor unit 114 or a calibration standard 116. As shown, the sensor unit 114 is connected in circuit through a connection interface $P_1/P_2$, and, if desired, can be located in a remote position from the schematic circuit of FIG. 2. In the preferred embodiment, the sensor unit 114 is a capacitive probe mounted in a tank T containing a selected quantity of a liquid L, such as fuel. The sensor unit 114 and the calibration standard 116 are connected to a transconductance amplifier 118 which provides an amplified output to a sample and hold circuit 120 which functions to sense representative voltage potentials from the sensor unit 114 or the calibration standard 116 in response to an appropriate command. The analog output of the sample and hold circuit 120 is provided to an analog-to-digital converter 122 which converts the analog value provided by the sample and hold circuit 120 to a corresponding multi-bit binary value A system controller 126 accepts the digital values provided via a bus 128 from the analog-to-digital converter 122 and uses those values to compute capacitance and resistance values, in a manner analogous to that described above for the embodiment of FIG. 1, and provide an appropriate output signal to an output port OUT. The system controller 126 also provides control signals to a logic controller 130 which periodically provides a SAMPLE command to the sample and hold circuit 120 to sense and retain the analog voltage values provided through the amplifier 118 by either the sensor unit 114 or the calibration standard 116. The system controller 126 also provides appropriate ENABLE/INHIBIT signals to the wave form generator 110 to initiate the capacitance and resistance determination cycle as well as a CAL/SEN signal to the switch 112 to either select the sensor unit 114 for evaluation or the calibration standard 116 to initiate an auto-calibration cycle In addition, a zero cross-over detector 132 is connected to the output of the wave form generator 110 and provides a signal to the logic controller 130 indicating the moment the output of the wave form generator 110 passes from a positive value through zero to negative value and, conversely, passes from negative value through zero to a positive value.

The wave form generator 110 provides a voltage output having the profile shown in FIG. 3, that is, an initial value of $+V$ that decreases in a linear manner through zero to a $-V$ value and which then remains fixed at $-V$ for a selected period before rising in a linear manner from $-V$ through zero and returning to the $+V$ potential. The output voltage profile shown in FIG. 3 is used to interrogate either the sensor unit 114 or the calibration standard 116 and determine the respective capacitance and resistance values, as described below. The switch 112 functions as the equivalent of a single-pole, double-throw switch in response to the CAL/SEN signal provided from the system controller 126. When a CAL signal is provided, the switch 112 switches the calibration standard 116 into the circuit to effect auto-calibration and, when the SEN signal is provided, the switch 112 switches the sensor unit 114 into the circuit to determine the capacitance and resistance values of the sensor unit 114. The amplifier 118 preferably has a low input impedance and acts as a current to voltage converter with a gain appropriate for the waveform repetition rate and capacitance value. The zero cross-over detector 132 functions to detect the cross over of the linearly declining and rising portions of the voltage profile of FIG. 3 and provide an appropriate output to the logic controller 130. While a number of devices can perform the zero cross-over detect function, an operational amplifier configured as a differential amplifier driving a bi-stable device can provide the desired output signal to the logic controller 130. The zero cross-over may also be performed by a fixed timer based on the waveform generator 110 timing characteristics. The system controller 126 is preferable a stored-program controlled micro-processor including a ROM containing an instruction set for implementing the functions described below, a RAM for storing values presented by the analog-to-digital converter 122, an accumulator, one or more general purpose storage registers, and input-output interfaces.

The circuit of FIG. 2 operates through an interrogation cycle to determine the capacitance and resistance values associated with the calibration standard 116 or the sensor unit 114. Where the sensor unit 114 has been selected by the system controller 126 and the appropriate SEN signal presented to the switch 112, the sensor unit 114 is placed in circuit with the waveform generator 110 and the amplifier 118 while the calibration standard 116 is effectively disconnected. In response to an ENABLE signal provided from the system controller 126, the waveform generator 110 presents a time-varying interrogation voltage through the switch 112 to the sensor unit 114. The interrogation voltage follows the profile shown in FIG. 3, starting at a $+V$ value and declining in a linear manner to the $-V$ value. As the interrogation voltage declines, the capacitance of the sensor unit 114 is charged with the potential rising in a manner inverse to the capacitance value. When the declining interrocation voltage intersects and passes through zero, the zero cross-over detector 132 provides an appropriate signal to the logic controller 130 which commands the sample and hold circuit 120 to sample the output of the amplifier 118, which output is representative of the capacitance-determined current through the sensor unit 114. The sampled value is converted to a digital value of selected bit width (e.g., 8 bits) with the digital value presented to the system controller 126 via the bus 128. The system controller 126 then computes the capacitance value for the sensor unit 114 and stores the computed value and/or provides the computed value as an output signal OUT. The capacitance determination can be accomplished by algebraic computation, as in the case of the embodiment of FIG. 1, or by table look-up where the sensed voltage level is compared with empirically determined voltages and corresponding capacitance values.

In order to effect the resistance determination, the system controller 126 presents an appropriate control signal to the logic controller 130 to again cause the sample and hold circuit 120 to sample the output of the amplifier 118. This second sample and hold command occurs at a predetermined time period after the detection of the zero-crossing when the interrogation voltage is constant at the value $-V$ prior to rising linearly from $-V$ to $+V$. The predetermined time period is a function of the repetition rate of the waveform generator 110. During the time period that the interrogation voltage is fixed at the value $-V$, the current drawn through the sensor 114 and the voltage potential provided by the amplifier 118 is solely a function of the resistance of the sensor unit 114 and is independent of any capacitance effect. The output of the sample and hold circuit 120 is provided to the analog-to-digital converter 122 which, in a manner analogous to that described above, provides a multi-bit digital value to the system controller 126 to effect the resistance determination.

In order to insure the ultimate accuracy of the capacitance and resistance measurements of the sensor 114, an auto-calibration function is performed using the calibration standard 116. Measurement errors and other inaccuracies can arise from a number of sources including the time-varying voltages provided by the waveform generator 110, hysteresis in the zero cross-over detector 132, impedances in the switch 112, and various other offsets and errors. In order to perform an auto-calibration, the system controller 126 provides an appropriate CAL selection signal to the switch 112 to switch the calibration standard 116 into the circuit and effectively disconnect the sensor unit 114. The waveform generator 110 is then enabled by an appropriate command from the system controller 126 to present the interrogation voltage through the switch 112 to the calibration standard 116. The sample and hold circuit 120 then functions in the manner described above to provide output values that are converted to digital values and presented to the system controller 126 for determination of the capacitance and resistance values of the calibration standard 116. Since the capacitance and resistance values of the calibration standard 116 are pre-determined, the difference between the respective values determined by the system controller 126 and the pre-determined values represents a calibration offset. Since the difference values for the capacitance and resistance are in digital form, the difference values are loaded into appropriate registers or memory locations and used to offset the measured values for the sensor unit 114, which offset values can be obtained immediately before or after a measurement cycle using the sensor 114.

As can be appreciated from the above, the present invention provides a method and apparatus for accurately determining capacitance and resistance values for an electrical component including various types of sensors. Additionally, an auto-calibration feature is provided whereby the accuracy of the measurement is enhanced.

Thus it will be appreciated from the above that as a result of the present invention, a highly effective apparatus and method for determining resistance and capacitance values is provided by which the principal objective, among others, is completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A method for determining capacitance and resistance characteristics of a fuel sensing electric component, comprising:
    providing a voltage control means for subjecting an electrical component to a time-varying voltage including a linear ramp voltage that passes from a first voltage level at a first polarity through zero to a second voltage level of opposite polarity;
    providing sensor means for sensing a current-dependent value of the electrical component during the linear voltage ramp of the time-varying voltage and for sensing the current-dependent value of the electrical component at a one of the first or second voltage levels;
    providing means for determining the capacitance of the electrical component from the sensed current-dependent values during the linear voltage ramp and the resistance from the sensed current-dependent values at the one of the first or second voltage levels,
    said voltage control means comprises:
    a stored-program controlled processor means having an output for providing control signals thereat; and
    providing means defining a controllable bounded integrator connected to said processor means for control by said processor means to provide a waveform having an initial voltage V of a first polarity that linearly changes through zero to a voltage V of opposite polarity and remains that the voltage V of the opposite polarity for a predetermined time period,
    said controllable bounded integrator means comprising:
    integrator rate control means for controlling the rate of change of the voltage,
    providing a calibration standard having a pre-determined resistance value,
    providing a calibration input signal to said voltage control means, whereby a calibration output value is provided,
    determining calibration offset errors of said voltage control means from said calibration output values and said pre-determined resistance value.

2. The method for determining capacitance and resistance characteristics of claim 1, wherein said voltage control means comprises:
    a waveform generator for providing a waveform having an initial voltage V of a first polarity that linearly changes through zero to a voltage V of opposite polarity and remains that the voltage V of the opposite polarity for a predetermined time period.

3. The method for determining capacitance and resistance characteristics of claim 1, wherein said sensor means comprises:
    a zero-crossing detector or timer, and a sample and hold circuit for sensing the potential across the component in response to an output of the zero-crossing detector.

4. The method for determining capacitance and resistance characteristics of claim 1, further comprising:
    providing a calibration standard and switch means for selectively switching said calibration standard in circuit with said voltage control and sensor means and disconnecting the electrical component.

5. An apparatus for determining capacitance and resistance characteristics of an electrical sensor in which the capacitance characteristic is representative of a sensed parameter, comprising:
    a stored-program controlled processor means having an output for providing control signals thereat;
    means defining a controllable waveform generator connected to said processor means for control by said processor means to provide a waveform having an initial voltage V of a first polarity that linearly changes through zero to a voltage v of opposite polarity and remains that the voltage V of the opposite polarity for a predetermined time period;
    switch means connected to said processor means for selectively switching an electrical sensor or a calibration standard in circuit with said waveform generator means;
    sensor means for sensing a current-dependent value of the electrical sensor and the calibration standard at about the zero-crossing of the time-varying voltage and for sensing the current-dependent value of the electrical sensor and the calibration standard at a one of the first or second voltage levels;

means for determining the capacitance of the electrical sensor from the sensed current-dependent values at the zero-crossing and the resistance from the sensed current-dependent values at the one of the first or second voltage levels, said waveform generator means comprising:

a controllable bounded integrator connected to said processor means for control by said processor means to provide a waveform having an initial voltage V of a first polarity that linearly changes through zero to a voltage V of opposite polarity and remains that the voltage V of the opposite polarity for a predetermined time period;

said controllable bounded integrator means comprising:

integrator rate control means for controlling the rate of change of the voltage;

a calibration standard having a pre-determined resistance value and adapted to provide a calibration input signal to said switch means, said processor means being adapted to receive a calibration output value from said switch means and to determine calibration offset errors of said switch means from said calibration output values and said pre-determined resistance value.

6. The apparatus for determining capacitance and resistance characteristics of claim 5, wherein said means for sensing comprises:

a sample and hold circuit connected to said processor means for sensing the potential across the sensor in response to a control signal from said processor means.

7. An apparatus for determining capacitance and resistance characteristics of a plurality of electrical sensors in which the respective capacitance characteristics are representative of a sensed parameter, comprising:

a stored-program controlled processor means having an output for providing control signals thereat;

means defining a controllable waveform generator connected to said processor means for control by said processor means to provide a wave form having an initial voltage V of a first polarity that linearly changes through zero to a voltage V of opposite polarity and remains that the voltage V of the opposite polarity for a predetermined time period;

said waveform generator means comprising:

a controllable bounded integrator connected to said processor means for control by said processor means to provide a waveform having an initial voltage V of a first polarity that linearly changes through zero to a voltage V of opposite polarity and remains at the voltage V of the opposite polarity for a predetermined time period; and said controllable bounded integrator means comprising:

integrator rate control means for controlling the rate of change of the voltage;

one-of-N multiplexer means connected to said processor means and having N outputs, at least one of said N output connected to a reference standard and N-1 of said outputs connected to respective sensors, said processor means selectively connecting said waveform generator means to a processor-selected one of the N outputs;

sensor means for sensing a current-dependent value of the selected sensor or reference standard at about the zero-crossing of the time-varying voltage and for sensing the current-dependent value of the selected sensor or the reference standard at a one of the first or second voltage levels;

said processor means being adapted for determining the capacitance of the selected sensor from the sensed current-dependent values at the zero-crossing and the resistance from the sensed current-dependent values at one of the first or second voltage levels;

a calibration standard having pre-determined resistance value and adapted to provide a calibration input signal to said multiplexer means, said processor means being adapted to receive a calibration output value from said multiplexer means and to determine calibration offset errors of said multiplexer means from said calibration output values and said pre-determined resistance value.

8. The apparatus for determining capacitance and resistance characteristics of claim 7, wherein said means for sensing comprises:

a sample and hold circuit connected to said processor means for sensing the current-dependent value of the selected sensor or the reference standard in response to a control signal from said processor means.

9. A system for determining capacitance and resistance characteristics of a capacitive fuel level sensing probe, comprising:

voltage control means for subjecting a capacitive fuel level sensing probe to a time-varying voltage including a linear ramp voltage that passes from a first level through zero to a second level, the second level having a polarity opposite from the first level;

sensor means for sensing a current-dependent characteristic of the sensing probe during the linear ramping of the time-varying voltage and for sensing the current-dependent characteristic when the voltage is at the voltage level; and means for determining the capacitance of the sensing probe from the current-dependent characteristic sensed during the linear ramping of voltage and the resistance from the current-dependent characteristic sensed at the second level;

said voltage control means comprising:

a waveform generator for providing a waveform having an initial voltage V of a first polarity that linearly changes through zero to a voltage V of opposite polarity and remains that the voltage V of the opposite polarity for a predetermined time period;

said sensor means comprising:

a zero-crossing detector and a sample and hold circuit for sensing the potential across the sensing probe in response to an output of the zero-crossing detector;

a processor means and a calibration standard having a pre-determined resistance value and adapted to provide a calibration input signal to said voltage control means, said processor means being adapted to receive a calibration output value from said voltage control means and to determine calibration offset errors of said voltage control means from said calibration output values and said pre-determined resistance value.

10. The system for determining capacitance and resistance characteristics of claim 9, further comprising:
a calibration standard and switch means for selectively switching said calibration standard in circuit with said voltage control and sensor means and disconnecting the sensing probe.

11. A method of determining capacitive and resistive characteristics of a fuel sensing electrical component having an error of 0.25 percent or less, comprising the steps of:
providing a calibration standard having a pre-determined resistance value.
providing a calibration input signal to a voltage control means, whereby a calibration output value is provided,
determining calibration offset errors of said voltage control means from said calibration output values and said pre-determined resistance value,
subjecting an electrical component to a time-varying voltage said time-varying voltage including a substantially linear ramp voltage that passes from a first level through zero to a second level, said second level having a polarity opposite from said first voltage level;
sensing a current-dependent characteristic of the electrical component during said linear voltage ramp of the time-varying voltage and sensing said current-dependent characteristic when said linear ramp voltage is at said second level,
determining the capacitance of said electrical component from said sensed current-dependent characteristic during said linear voltage ramp,
subjecting said electrical component to a substantially constant voltage before and after said electrical component is subjected to said substantially linear ramp voltage, and
determining the resistance of said electrical component from said current-dependent characteristic of said electrical component sensed by said constant voltage level.

12. The method of claim 11 further comprising:
subjecting a calibration standard having known capacitive and resistive characteristics to a time-varying voltage including a linear ramp voltage that passes from a first voltage level through zero to a second voltage level of opposite polarity;
sensing the current-dependent characteristic of the calibration standard at the zero-crossing and sensing the current-dependent characteristic when the voltage is at about the second level; and
sensing the current-dependent characteristic when the voltage is at the second level;
determining the capacitance of the sensing probe from the current-dependent characteristic sensed at the zero-crossing and the resistance from the voltage potential sensed at the fixed voltage level of both the sensing probe and the calibration standard, and the current-dependent characteristic of the calibration standard near the fixed voltage level.

13. A method of determining capacitive and resistive characteristics of a capacitive fuel level sensing probe, comprising the steps of:
providing a calibration standard having a pre-determined resistance value,
providing a calibration input signal to a voltage control means, whereby a calibration output value is provided,
determining calibration offset errors of said voltage control means from said calibration output values and said pre-determined resistance value,
subjecting a capacitive fuel level sensing probe to a time-varying voltage including a linear ramp voltage that passes from a first voltage level through zero to a second voltage level of opposite polarity;
sensing a current-dependent characteristic of the sensing probe at about the zero-crossing and sensing the current-dependent characteristic when the voltage is at the second level;
subjecting a calibration standard having known capacitive and resistive characteristics to a time-varying voltage including a linear ramp voltage that passes from a first voltage level through zero to a second voltage level of opposite polarity;
sensing the current-dependent characteristic of the calibration standard at the zero-crossing and sensing the current-dependent characteristic when the voltage is at about the second level; and
sensing the current-dependent characteristic when the voltage is at the second level;
determining the capacitance of the sensing probe from the current-dependent characteristic sensed at the zero-crossing and the resistance from the voltage potential sensed at the fixed voltage level of both the sensing probe and the calibration standard, and the current-dependent characteristic of the calibration standard near the fixed voltage level.

14. A method of determining capacitance and resistance calibration offset errors of a system circuitry for providing a waveform to a capacitive fuel level sensing probe, comprising:
providing a fuel tank, a capacitive fuel level sensing probe, a calibration standard, a system circuitry, and a system controller,
said calibration standard having a pre-determined resistance value,
said system circuitry being connected to said system controller,
said system circuitry being adapted to provide a waveform to said capacitive fuel level sensing probe,
said tank enclosing liquid fuel, said sensing probe being supported by said tank in contact with said fuel, said calibration standard and said sensing probe being adapted to be selectively connected to and disconnected from said system circuitry,
disconnecting said sensing probe from said system circuitry,
providing a calibration input signal from said system controller to said system circuitry, said system circuitry providing a calibration output value to said system controller in response to said calibration input signal,
determining resistance calibration offset errors of said system circuitry from said calibration output values and said pre-determined resistance value.

15. The method of claim 14 further comprising providing an aircraft, said fuel tank being supported by said aircraft.

16. The method of claim 14 further comprising connecting said sensing probe to said system circuitry.

17. The method of claim 14 further comprising:
subjecting said capacitive fuel level sensing probe to a time-varying voltage including a linear ramp voltage that passes from a first voltage level through zero to a second voltage level of opposite polarity;

sensing a current-dependent characteristic of the sensing probe at the zero-crossing and sensing the current-dependent characteristic when the voltage is at the second level;

subjecting said calibration standard to a time-varying voltage including a linear ramp voltage that passes from a first voltage level through zero to a second voltage level of opposite polarity;

sensing the current-dependent characteristic of the calibration standard at the zero-crossing and sensing the current-dependent characteristic when the voltage is at the second level;

subtracting said resistance calibration offset error of said system circuitry from said characteristics of said sensing probe to provide corrected current-dependent characteristics, and determining the capacitance of the sensing probe from the corrected current-dependent characteristics.

18. The method of claim 14 further comprising subjecting said sensor to a time-varying voltage including a linear ramp voltage that passes from a first level through zero to a second level, the second level having a polarity opposite from the first voltage level;

sensing a current-dependent characteristic of said sensor at the zero-crossing and sensing the current-dependent characteristic when the voltage is at the second level; and determining the capacitance of said sensor from the sensed current-dependent characteristic at the zero-crossing and the resistance from the current-dependent characteristic sensed at the fixed voltage level.

* * * * *